United States Patent [19]
Everroad

[11] Patent Number: 5,048,417
[45] Date of Patent: Sep. 17, 1991

[54] COMPACT APPARATUS FOR SCREEN PREPARATION AND PRINTING AND METHOD OF USE

[76] Inventor: Michael A. Everroad, 3312 Sam Rayburn Run, Carrollton, Tex. 75007

[21] Appl. No.: 518,938

[22] Filed: May 4, 1990

[51] Int. Cl.$^5$ .................... B41F 15/12; B41F 15/00
[52] U.S. Cl. .................... 101/123; 101/126; 101/128.4; 101/129; 355/113
[58] Field of Search ............ 101/128.21, 128.4, 127.1, 101/127, 123, 126, 129, 481, 485, 486, DIG. 36; 33/613, 614, 615, 620, 621; 355/113, 91, 85, 100

[56] References Cited

U.S. PATENT DOCUMENTS

| | | | |
|---|---|---|---|
| 2,206,176 | 7/1940 | Foard | 101/126 |
| 3,788,215 | 11/1974 | Lambert | 101/123 |
| 3,964,385 | 6/1976 | Knight | 101/128.4 |
| 4,073,232 | 2/1978 | Brewer | 101/126 |
| 4,517,894 | 5/1985 | Davis et al. | 101/126 |
| 4,569,832 | 2/1986 | Sato et al. | 101/114 |
| 4,606,688 | 8/1986 | Jaffa | 101/115 |
| 4,628,813 | 12/1986 | Hasegawa et al. | 101/116 |

*Primary Examiner*—Clifford D. Crowder
*Attorney, Agent, or Firm*—Hubbard, Thurman, Tucker & Harris

[57] ABSTRACT

A compact, multi-function screen printing table is provided which, with the exception of the emulsion rinsing step, permits all of the steps of a screen printing process to be carried out at a single, space-saving work station. The upper side of the table is provided with a translucent foam-backed glass cover plate which cooperates with a clear glass base plate to form a vacuum exposure chamber and, when in a lowered position, also forms a convenient work surface for screen assembly, layout and stripping purposes. The cover plate is also used in conjunction with an automated printing arm assembly to carry out the actual imprintation process. The cover plate is movably mounted on the base plate and may be selectively and adjustably moved to effect precise registration and alignment between a printing screen and a substrate. Suitable backlighting and exposure lighting systems are disposed in a housing which depends from the table top. Carried beneath the table top are a vacuum system for use in the exposure process, and a table top exhaust and filtration system used during the imprintation process. In an alternate embodiment of the table, the vacuum exposure chamber is relocated to a slopping front side surface of the depending table housing to permit exposure and printing operations to be conducted simultaneously.

32 Claims, 5 Drawing Sheets

COMPACT APPARATUS FOR SCREEN PREPARATION AND PRINTING AND METHOD OF USE

BACKGROUND OF THE INVENTION

The present invention relates generally to screen printing apparatus and methods, and more particularly provides a uniquely configured emulsion exposure unit, vacuum frame, layout/stripping, printing table and air filtration system which, with the exception of emulsion rinsing equipment, very compactly combines in a single structure all of the equipment and work space necessary to carry out, on a relatively large commercial scale, an indirect screen preparation and screen printing process.

The process of "screen printing" is conventionally utilized to print advertising indicia, artwork and the like on paper stock, T-shirts, caps, and a variety of other products. This process is typically carried out by providing a "positive" sheet of plastic film having the desired indicia thereon. A transfer emulsion sheet, consisting of an acetate backing sheet having a suitable layer of light sensitive emulsion coating deposited on one side thereof, is placed on the positive film sheet and the two sheets are firmly held together by a vacuum force while they are exposed to a suitable exposure light source. During the exposure process, the indicia area on the film positive sheet masks a corresponding area of the emulsion film, leaving a non-exposed area of the emulsion film which corresponds to the indicia on the film positive sheet.

After this exposure process is completed, the transfer sheet is rinsed with water to wash away the non-exposed area of its emulsion film. The transfer sheet is then placed against the bottom side of a framed screen element and suitably adhered thereto. When the remaining emulsion has dried on the screen, the acetate type backing portion of the transfer sheet is peeled away leaving the emulsion adhered to the screen. The adhered emulsion has various openings therein which correspond to the indicia originally on the film positive sheet. The finished printing screen is then checked for emulsion defects, such as pin holes and the like, by viewing over the lit top surface through the screen. Any defects in the adhered emulsion can be repaired by applying a suitable blocking material thereto.

When the assembled printing screen is ready for use, the item to be imprinted (such as a sheet of paper stock) is placed below the screen on the glass top table surface or suitable platen in appropriate alignment with the emulsion thereon. Ink is then forced downwardly through the emulsion openings in the screen onto the article to form the desired advertising indicia or artwork thereon. Typically, this inking process is carried out by using a "squeege" element which is drawn across the upper surface of the screen to flow ink downwardly through the emulsion openings therein and onto the imprintable item.

Even on a relatively small commercial scale, this type of screen printing process conventionally has required a relatively large and expensive assortment of individual screen printing equipment components which occupy a significant amount of floor space. Specifically, as conventionally carried out, this type of screen printing process requires, among other separate elements, a screen printing surface (such as a printing table) to carry out the actual imprintation portion of the process, a separate light exposure unit to effect the initial exposure of the emulsion film, a vacuum system to hold the film positive element and the transfer emulsion sheet together during the exposure portion of the process, separate screen washing apparatus for rinsing away the non-exposed area of the emulsion film, and a separate light table for use in the screen "checking" portion of the printing process and for stripping and layout purposes.

As evidenced in U.S. Pat. No. 3,964,385 to Knight, at least one attempt has been made to provide less expensive and more compactly arranged screen printing apparatus. The Knight device is designed for use in the direct screen printing process (the forerunner of the modern "indirect" method) and comprises a box constructed with one side having a removable glass sheet on which may be stacked an opaque film positive sheet, a screen with a delayed photosensitive emulsion, a foam pad or sheet, a rigid backup plate, and a hold down strap removably connectable to the box to hold these stacked elements in contact with one another so that the screen may be exposed to a flood light within the box for a time sufficient to suitably expose the photosensitive emulsion.

After the exposure portion of the process is completed, the hold down strap is removed and the stacked elements are disassembled. The screen is thereafter washed to develop the printing image and is placed inside the box to dry. After the finish screen is dried, the box is turned on its side to horizontally position an exterior vacuum plate side portion thereof. The screen is then pivotally connected to the box so that it overlies the vacuum plate. An imprintable item is then positioned on the horizontal vacuum plate beneath the pivotally mounted screen and a blower within the box is energized to draw ambient air inwardly through the vacuum plate to hold the imprintable item thereon. Ink is then applied to the screen and forced therethrough onto the imprintable item by moving a squeege member of the like across the screen.

The Knight device, though compact and portable, has a variety of limitations and disadvantages which render it generally unsuitable for use in the modern indirect screen printing process. For example, as stated in the Knight specification, the device is suitable for screen printing only on a "small scale". Because of the need to pivot the box from its screen-forming position to its printing position, the Knight device, if constructed in the much larger size necessary to imprint much larger items on a high volume commercial scale, would be highly unwieldy and difficult to use. Additionally, on even a relatively small commercial production scale, the use of the Knight device would provide an undesirably slow overall printing process due to the need to assemble, disassemble and reassemble various of its components during the overall screen formation and printing process. Additionally, because of the pressure hold down system used to hold the film positive sheet against the emulsion portion of the screen, the "fine line" printing capabilities required in the modern indirect screen printing process could not easily be achieved, if at all. The Knight device would thus be unacceptable from a printing quality standpoint in a great many commercial and artistic printing projects.

It can be seen from the foregoing that it would be highly desirable to provide more compact and relatively inexpensive screen printing apparatus which is better suited to the high quality and volume demands associated with commercial scale screen printing activities. It is accordingly an object of the present invention to provide such improved screen printing apparatus and methods associated therewith.

SUMMARY OF THE INVENTION

In carrying out principles of the present invention, in accordance with a preferred embodiment thereof, compact screen printing table apparatus is provided which, with the exception of conventional emulsion rinsing equipment, uniquely combines in a single structure all of the equipment necessary to carry out on a commercial scale a screen printing process of the type previously described.

In a preferred embodiment thereof, the screen printing table comprises a rectangular base frame structure supported in an elevated position by suitable table legs secured thereto. A metal housing depends from the base frame structure and has an open upper end across which the frame opening extends. Horizontally supported within the frame opening is a transparent glass base plate.

A translucent glass cover plate is positioned above the base plate in a spaced relationship therewith. The cover plate is secured within an inner frame which is pivotally secured at its rear side edge to an outer frame that is slidably supported on an intermediate portion of the base frame structure. The outer cover plate frame may be selectively shifted relative to the base frame structure, and the base plate, by means of a series of frame adjustment screw members which are horizontally threaded inwardly through an outer portion of the base frame structure and bear at their inner ends against the front side of the outer cover plate frame and a contiguous rearwardly extending side thereof. Positioned oppositely from the adjustment screws are a series of small compression spring members which are interposed between and bear at their opposite ends against the outer base frame structure portion and the other two sides of the outer cover plate frame.

The inner cover plate frame may be pivoted relative to the movable outer cover plate frame between a raised position permitting access to the upper surface of the stationary base plate, and a lowered position in which the inner cover plate frame is disposed within its outer frame and the cover plate horizontally overlies the base plate in a vertically spaced relationship therewith. A sheet of translucent, open-cell foam rubber material is secured to the underside of the cover plate and is peripherally bordered by a resilient seal element also secured to the underside of the cover plate.

A printing frame is also pivotally secured to the rear side of the base frame for movement between a raised position permitting access to the upper side surface of the cover plate in its lowered position, and a lowered position in which the printing arm overlies the lowered cover plate. The printing arm has movably mounted thereon a squeege structure provided with separate flood and printing squeege elements.

To use the printing table in the screen printing process, the printing arm and the cover plate are moved to their raised positions and a film positive sheet is placed on the upper side surface of the transparent base plate. An acetate film-backed emulsion sheet is then placed atop the film positive sheet and the cover plate is lowered. With the cover plate in its lowered position, the foam rubber sheet secured thereto presses the film positive and emulsion sheets together, and the cover plate seal element is compressed between the cover plate and the base frame to form a compact exposure chamber between the base and cover plates. A vacuum pump is then energized to create a vacuum within the exposure chamber to even more firmly and uniformly hold the film positive and emulsion sheets in contact with one another.

With the film positive and emulsion sheets held firmly and uniformly together by the foam rubber sheet and the vacuum created within the exposure chamber, an exposure light source disposed within the housing is energized for an appropriate length of time to expose the emulsion sheet. An electrical interlock with a light sensing mechanism activates shutters located over exposure lamps so that when the lamps are at a predetermined intensity the shutters are opened. After exposure of the emulsion sheet, the exposure light source is de-energized, the vacuum pump is turned off, the cover plate is raised, and the film positive and emulsion sheets are removed. The exposed emulsion sheet is then rinsed in a conventional manner to remove the non-exposed areas thereof which were previously blocked by the indicia on the film positive sheet. Next, the rinsed emulsion sheet is operatively positioned, emulsion side up, on the bottom side of a framed printing screen, allowed to dry thereon, and the backing film is peeled away from the dried emulsion. A convenient work surface for this screen fabrication portion of the overall screen printing process may be formed simply by lowering the translucent cover plate and using the upper side surface thereof as such work surface. The resulting work surface may also be used for stripping purposes and is bordered by a squaring edge portion of the base frame which may be used for layout purposes.

Emulsion defects in the assembled screen placed atop the lowered cover plate are readily and easily highlighted by energizing a backlighting source disposed within the table housing. The resulting backlight directed through the base and cover plates and the screen emulsion readily reveals pin holes and other irregularities in the contacted emulsion which may be quickly corrected by applying a suitable blocking material thereto.

The finished and corrected printing screen may then be used in the actual printing portion of the overall printing process. An item to be imprinted, such as a sheet of paper stock, is suitably secured to the upper side surface of the lowered cover plate and the printing screen is operatively positioned over the item, in a generally aligned relationship therewith, and secured to a rear set of frame clamps on a pivotal printing arm structure. A front side edge portion of the screen is then secured to a front side portion of the printing arm, by means of front frame clamps thereon, for movement therewith toward and away from the item to be imprinted.

Prior to the actual imprintation of the item it is moved into precise alignment with the secured printing screen positioned thereover by appropriately horizontally shifting the outer cover plate frame using the previously mentioned frame adjustment screws.

With the printing arm and the screen in raised positions, and printing ink suitably "flooded" onto the upper surface of the screen, a "print" button on a control panel associated with the table is pressed. Control means then responsively function to lower the printing frame and screen. Lowering of the printing frame causes a motorized cable and pulley system to drive the squeege structure forwardly along the printing frame and simultaneously pivot the squeege structure to operatively move its printing squeege element along the top of the screen to drive ink therethrough onto the imprintable item beneath the screen. When the squeege structure reaches a forward limit position it engages a forwardly positioned microswitch which raises the printing frame and reverses the cable and pulley system drive motor. Reversal of the motor drives the dual squeege structure rearwardly along the printing frame and pivots the flood squeege element downwardly into engagement with the screen, drawing it along the screen in a flood stroke to redistribute printing ink thereon. When the squeege structure reaches a rear limit position it engages a second microswitch which de-energizes the cable and pulley system drive motor and causes the printing arm to be raised. The imprinted item is then removed, another imprintable item is positioned beneath the raised screen, and the "print" button is depressed again to initiate another printing cycle.

It can be readily seen from the foregoing that the present invention provides a single, relatively compact printing work station at which, with the exception of the emulsion rinsing step, may be easily used to perform all of the steps necessary to carry out on a relatively larger commercial scale all of the steps necessary to perform the entire screen printing process, including the layout and stripping, exposure, checking, and correction of the printing screen together with the actual imprintation steps. Additionally, an air ventilation system is utilized to exhaust air and toxic fumes from the printing work station, filter out the fumes and delivers the exhausted air back into the working area. Importantly, no disassembly and reassembly of the screen printing apparatus is required, and the overall orientation of such apparatus need not be altered. Because of the combination of positive pressure and vacuum hold down used on the film positive and emulsion sheets during the emulsion exposure process, the apparatus provides exceptionally good "fine line" reproduction capabilities. Moreover, the compact screen printing table apparatus of the present invention may be easily and relatively inexpensively constructed from simple and commercially available components.

The very desirable compactness of this all-in-one screen printing apparatus arises to a large extent from the unique positioning and cooperation between and among various of its components. For example, as described above, the cover plate forms a backlighting checking surface and also cooperates with the base plate to define the compact vacuum and exposure chamber therewith. The translucent cover plate, in addition to cooperating with the base plate to form such chamber, can also be used as a layout and stripping work surface upon which to rest the screen printing frame during the contacting of the emulsion thereto. The cover plate additionally functions as a printing support surface, and a registration and alignment device, for carrying out the imprintation steps in conjunction with the conveniently positioned printing arm with the dual squeege structure movably supported thereon.

In an alternate embodiment thereof, the printing table is modified to conveniently permit simultaneous performance of both exposure and printing operations. This modification is effected by forming the front wall of the depending table housing with a clear glass plate, and pivotally securing the foam-backed cover plate thereto to form therewith the previously described vacuum exposure chamber. The exposure light apparatus within the housing is appropriately re-oriented to direct its light outwardly through the glass portion of the housing by means of a shutter system. A framed upper glass plate is slidably rested upon the intermediate base frame structure portion to define the previously described combination printing and work surface, and also functions as the previously described registration and alignment means, being operatively engaged by the frame adjustment screws and their associated spring elements. In this manner, a printing or screen working operation may be performed on the upper glass plate while an exposure operation is being simultaneously performed within the re-oriented exposure chamber.

DETAILED DESCRIPTION

Figures 1, 16:
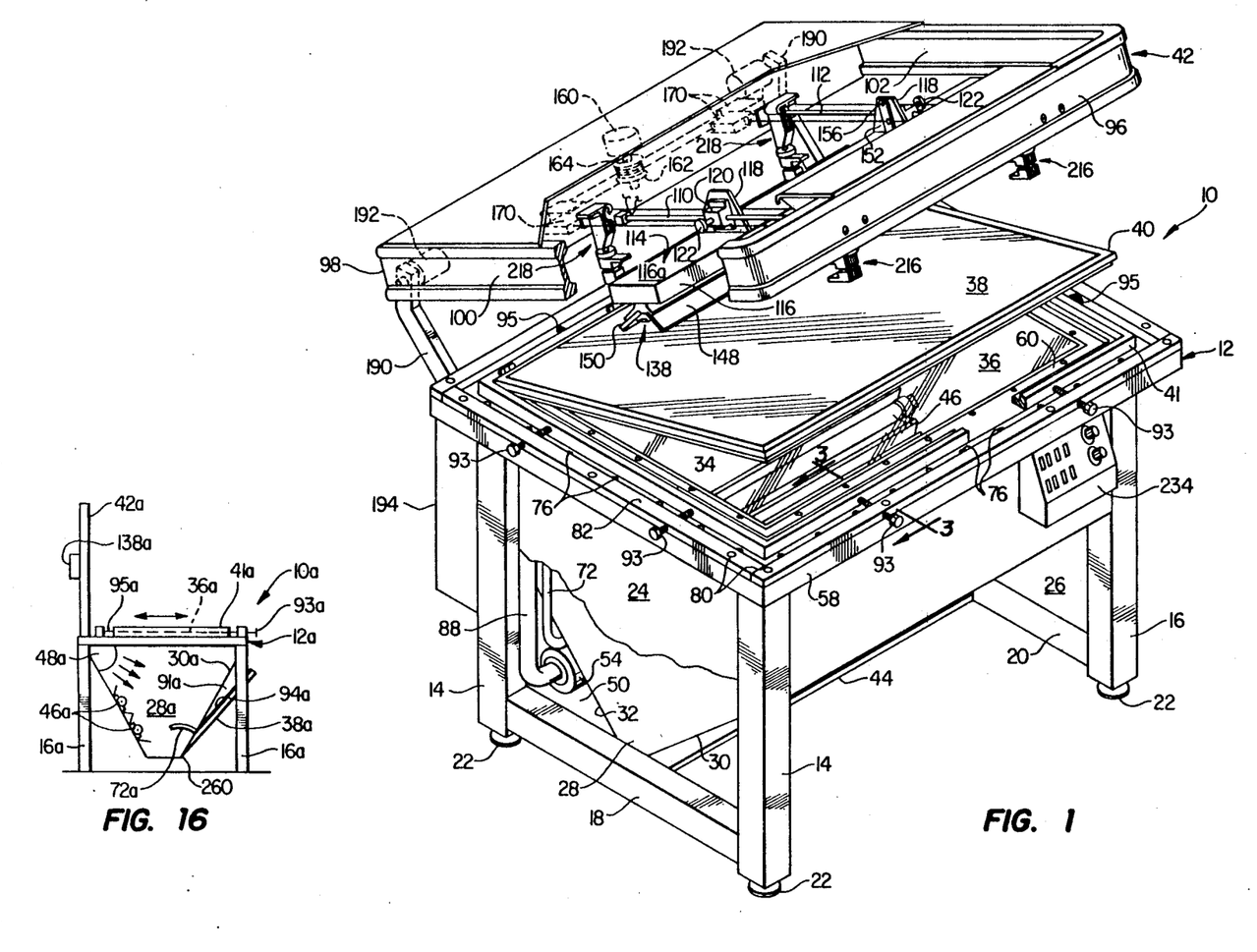
FIG. 1 is a partially cut away perspective view of a compact, multi-function screen printing table which embodies principles of the present invention, printing arm support structure and upper glass plate portions of the table being illustrated in raised positions thereof.
FIG. 16 is a simplified schematic cross-sectional view, similar to that of FIG. 2, through an alternate embodiment of the screen printing table.

Perspectively illustrated in FIG. 1 is a multi-function screen printing table 10 which embodies principles of the present invention. With the exception of conventional emulsion rinsing equipment, the table uniquely combines in a single compact structure all of the equipment and work space necessary to carry out, on a commercial scale, an indirect emulsion printing process including the exposure of an emulsion sheet, the preparation of a printing screen incorporating the exposed emulsion sheet, including layout and stripping procedures the backlighting, checking, and correction of the assembled printing screen, and the use of the screen to carry out the actual substrate imprintation process. Importantly, this advantageously eliminates the previous necessity of purchasing separate devices to carry out the emulsion exposure, screen preparation, screen checking, and substrate imprintation steps required in the screen printing process. Accordingly, the table 10 significantly reduces both the equipment cost and the floor space previously required to screen print, on a commercial scale, various items such as posters, art work, advertising material, T-shirts and the like.

The table 10 includes an elongated, rectangular base frame structure 12 which is supported in an elevated, horizontal position by a pair of hollow metal support legs 14 extending downwardly from its left end corners, and a pair of hollow metal support legs 16 extending downwardly from its right end corners. The support leg pairs 14, 16 are respectively interconnected adjacent their lower ends by suitable bracing members 18 and 20, the support legs being provided at their lower ends with suitable adjustable leveling pads 22. Positioned inwardly of the support leg pairs 14, 16 are a pair of cover plates 24 and 26 which extend from the frame structure 12 to the lower end of the support legs. The table 10 is provided with an elongated, open-topped metal housing 28 which depends from the frame 12 and extends longitudinally between the cover plates 24, 26. Housing 28 has a generally V-shaped lower side portion that is defined by sloping front and rear wall portions 30 and 32. The open top of the housing 28 is positioned directly beneath the elongated rectangular opening 34 in the frame structure 12.

Supported within the frame opening 34 is a clear glass base plate 36. Directly above the base plate 36 is a translucent glass cover plate 38 supported in a metal inner frame 40 extending around its periphery. Inner frame 40 is pivotally secured at its rear side edge to the rear side edge of a rectangular metal outer support frame 41 for movement relative thereto between a raised position (shown in FIG. 1) in which the base plate 36 is accessible through the outer frame 41, and a horizontal, lowered position in which the inner frame 40 is received within the outer frame 41 and the cover plate 38 overlies the base plate 36 in a vertically spaced relationship therewith. In a manner and for a purpose subsequently described, the outer frame 41 is slidably supported on the base frame structure 12 for selective movement relative thereto.

An elongated rectangular printing arm assembly 42 is supported along a rear side edge portion thereof above the cover plate 38, also in a manner subsequently described, for pivotal movement between a raised position illustrated in FIG. 1, and a horizontal, lowered position in which the assembly 42 overlies the cover plate 38 in its lowered position.

Figures 2, 6:
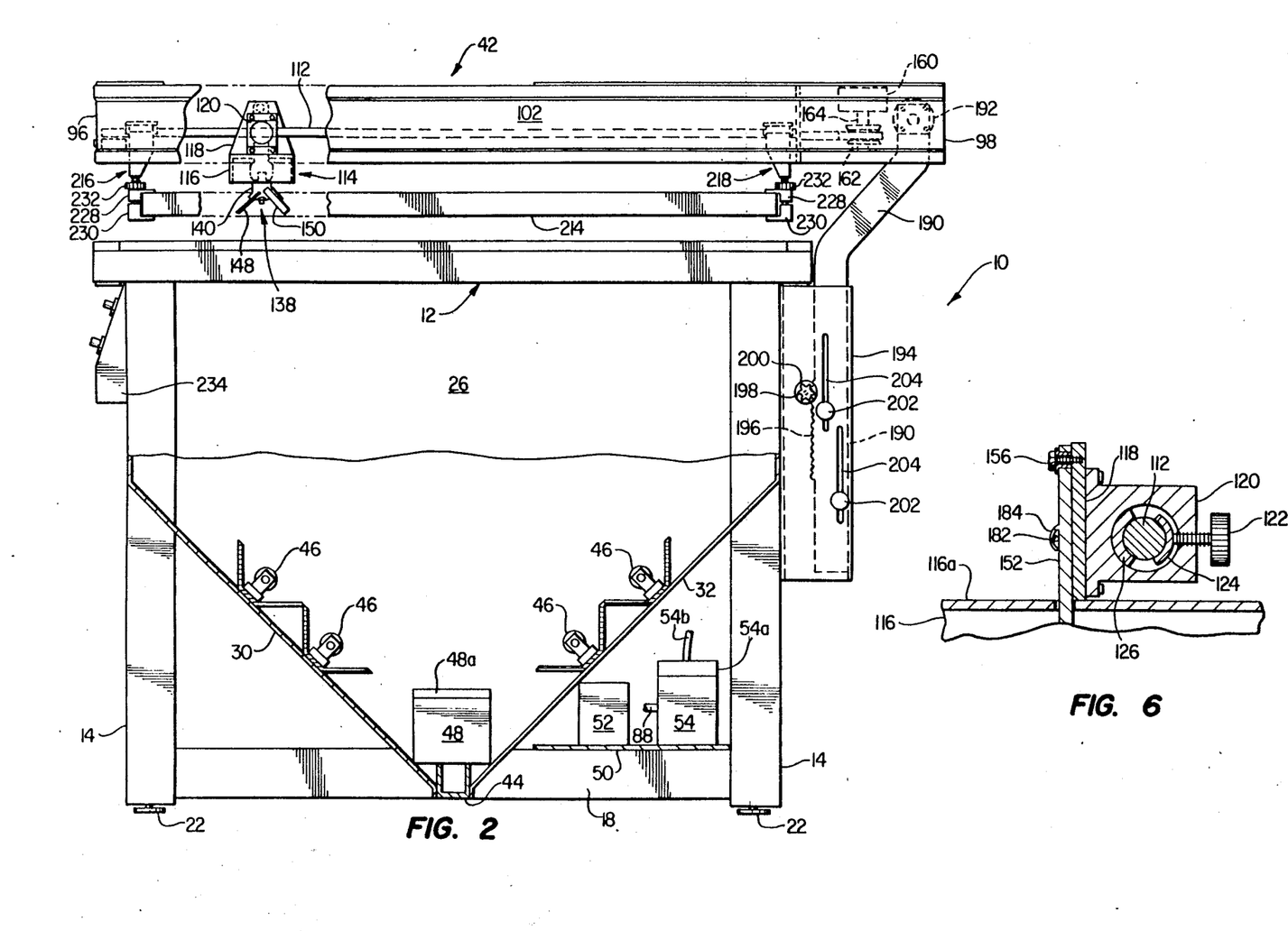
FIG. 2 is a partially cut away right end elevational view of the table, with the printing arm support structure and upper glass plate portions thereof in their lowered positions and a printing screen being operatively positioned above the table.
FIG. 6 is an enlarged scale cross-sectional view through another portion of the squeege assembly, taken along line 6—6 of FIG. 4.

Referring now to FIG. 2, the sloping lower front and rear side wall portions 30, 32 of the housing 28 are secured at their lower ends to a support beam 44 which is interconnected at its opposite ends to the lower bracing members 18 and 20. Two horizontally extending rows of backlighting elements 46 are secured to each of the lower side wall portions 30, 32 within the interior of the housing 28, while a pair of exposure lighting elements 48, with associated shutter devices 48a, are supported on the beam 44 within the housing. A horizontally extending metal support plate 50 extends rearwardly from a lower side edge portion of the sloping rear housing wall 32 and carries a vacuum pump 52, and an exhaust fan 54, the elements 52, 54 being schematically depicted in FIG. 2 for illustrative purposes.

Figure 3:
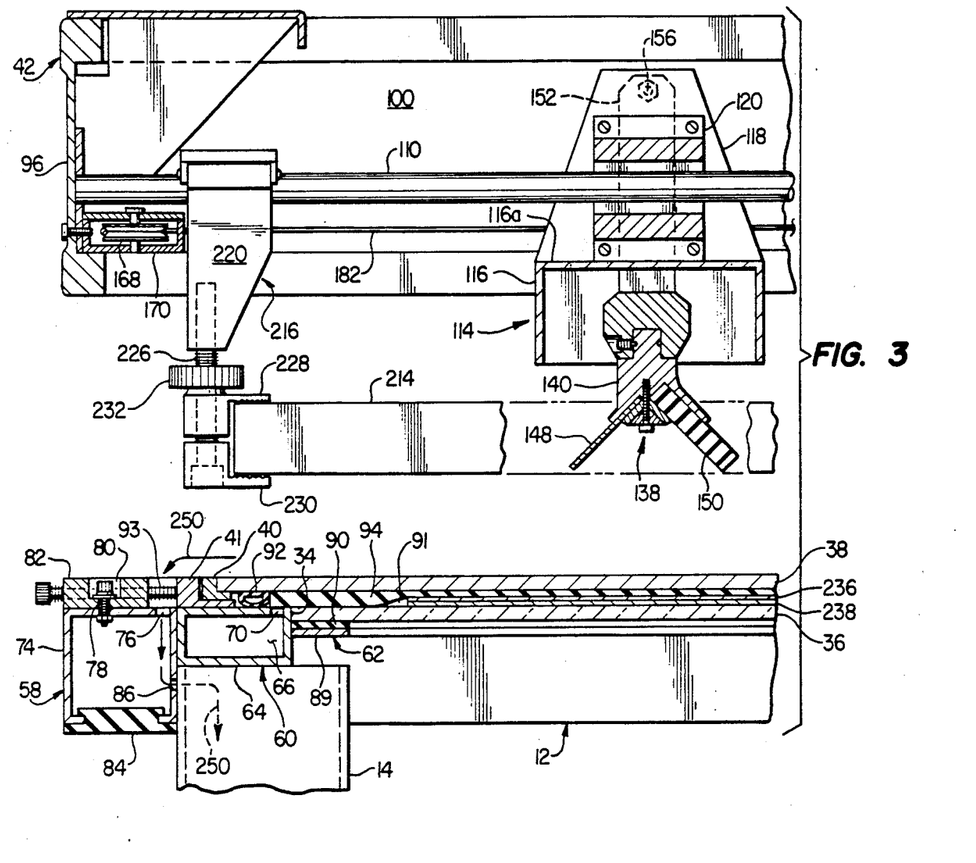
FIG. 3 is an enlarged scale partial cross-sectional view through the table, taken along line 3—3 of FIG. 1, illustrating stacked emulsion and film positive sheets being exposed while positioned between a lower clear glass plate portion of the table and the upper glass plate in its lowered position, the printing arm support structure also being in its lowered position.

As illustrated in FIGS. 1 and 3, the elevated base frame structure 12 includes three elongated rectangular sections—a horizontally outer section 58, a horizontally intermediate section 60, and a horizontally inner section 62. The intermediate frame section 60 is defined by intersecured lengths of rectangularly cross-sectioned hollow metal channel members 64 that are supported on the top ends of the support legs 14, 16 and define a rectangular vacuum plenum 66 which is utilized in a manner subsequently described. Above the open upper end of the rear support leg 14, the adjacent section of a channel member 64 has formed in its bottom wall a series of small outlet openings (not illustrated) which communicate the plenum 66 with the interior of the rear support leg 14. A series of mutually spaced inlet openings 70 (FIG. 3) are formed through the upper walls of the channel members 64. A vacuum inlet hose 72 (FIG. 1) is communicated at one end thereof with the interior of the rear support leg 14, while the opposite end of the hose 72 is operatively connected to the inlet of the vacuum pump 52 (FIG. 2).

The outer frame section 58 is defined by intersecured, generally inverted U-shaped channel members 74 which extend outwardly around the intermediate frame section 60 and have a mutually spaced series of inlet openings 76 formed in their upper walls adjacent the juncture between the outer and intermediate frame sections 58, 60. Secured to the upper walls of the channel members 74 by suitable fastening bolts 78 extending downwardly through recesses 80 therein is a generally U-shaped metal squaring frame section 82 which extends along the front, left and right outer side edge portions of the frame 12.

As best illustrated in FIG. 3, the open lower sides of the channel members 74 are closed by resilient plug strips 84, and the inner side of the channel member 74 to the left in FIG. 3 is provided with an outlet opening 86. An exhaust hose 88 (FIG. 1) is interconnected between the outlet opening 86 and the inlet of the exhaust fan 54.

The inner frame section 62 is defined by intersecured support bars 89 secured to the inner side walls of the channels 64 below their upper side wall surfaces. The frame opening 34 is positioned at the juncture between the channels 64 and bars 89 and is bordered by a resilient seal element 90 upon which the rectangular periphery of the clear glass base plate 36 rests.

In its lowered position, the cover plate 38 is spaced upwardly a small distance from the base plate 36 so that the plates 36, 38 define therebetween a relatively thin, rectangular vacuum chamber 91. The periphery of the vacuum chamber 91 is sealed by a resilient gasket and seal structure 92 secured to the underside of the cover plate 38 around its periphery. Also suitably secured to the underside of the cover plate 38, and extending inwardly from the gasket and seal structure 92, is a sheet of resilient, translucent open-cell foam rubber material 94. The cover structure defined by plate 38 and the foam sheet 94 secured thereto is thus translucent.

As best illustrated in FIG. 3, the outer cover plate frame 41 slidably rests upon the intermediate base frame structure portion 60. Accordingly, the frame 41, together with the inner frame 40 and the cover plate 38 which it supports, is slidably movable relative to the base frame structure 12 and the stationary base plate 36. For purposes subsequently described, selective horizontal movement of the outer cover plate frame 41 may be effected by a series of frame adjustment screw members 93 (see FIGS. 1 and 3) which are threaded horizontally inwardly through front and left side portions of the squaring frame section 82 and bear at their inner ends against corresponding side portions of the outer cover plate frame 41. Small compression spring elements 95 (FIG. 1) are interposed between the squaring frame section 82 and the rear and right sides of the frame 41, and resiliently resist the horizontal movement of frame 41 caused by the adjustment of screws 93.

Figure 4:
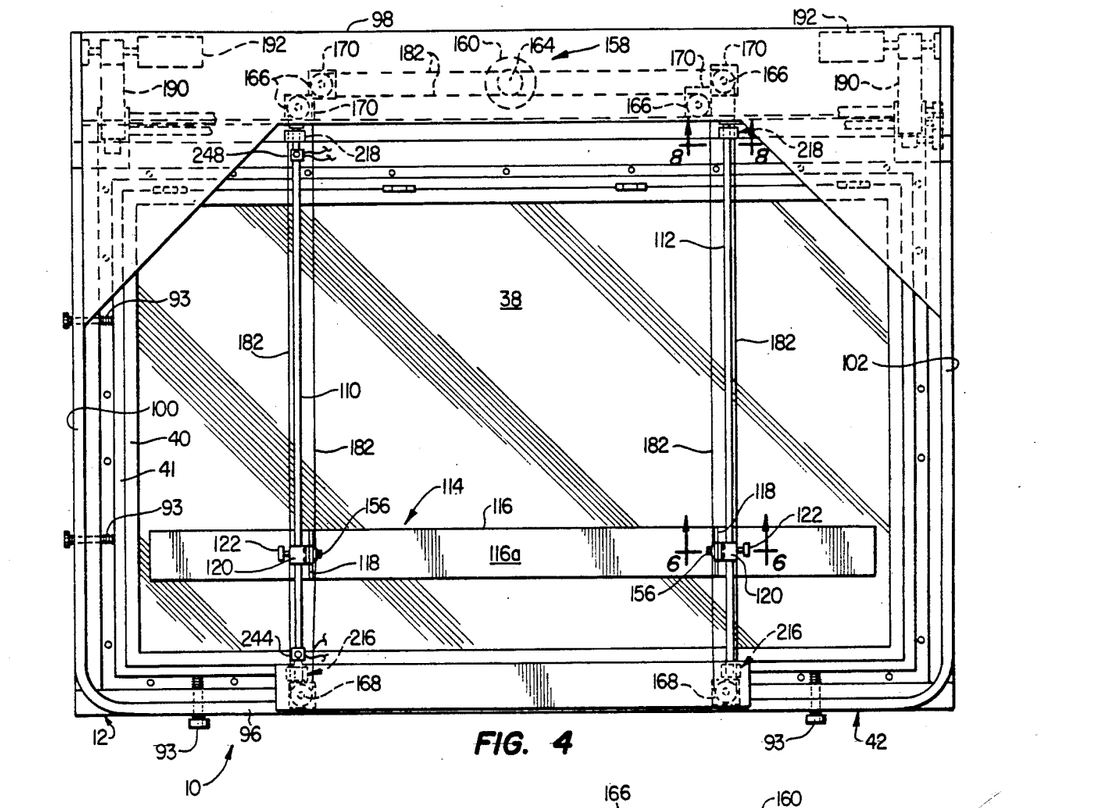
FIG. 4 is a top plan view of the table with its printing arm support structure and upper glass plate in their lowered positions.

With reference now to FIGS. 1, 2 and 4, the printing arm assembly 42 includes an elongated rectangular frame structure having front and rear sides 96 and 98, and left and right ends 100 and 102. Intersecured between the front and rear arm frame sides 96, 98 are a pair of bearing shafts 110, 112. Shafts 110, 112 movably carry a pivotally operative squeege support structure 114 which, in a manner subsequently described, is utilized to carry out the final imprintation step in the overall screen printing process.

As illustrated in FIGS. 1 and 4-6, the squeege support structure 114 includes an elongated metal support channel 116 positioned beneath and transverse to shafts 110, 112 and having an upper side wall 116a. Opposite end portions of the channel 116 are slidably mounted on shafts 110, 112 by vertical tabs 118 which are anchored to the upper channel side wall 116a and carry rectangular mounting structures 120 that slidably receive the shafts 110, 112 so that the squeege support structure 114 can slide forwardly and rearwardly along the shafts 110, 112. Frictional adjustment of this sliding motion is provided by adjustment screws 122 threaded into the mounting structures 120 and bearing at their inner ends against arcuate friction members 124 which engage the shafts and adjustably press them laterally against complementary arcuate members 126 on their opposite sides.

The squeege support structure 114 also includes an elongated dual squeege assembly 138 which is positioned beneath and extends parallel to the upper channel wall 116a. Squeege assembly 138 comprises an elongated squeege carrier or support member 140 positioned beneath and extending parallel to the upper channel wall 116a. A downwardly and forwardly sloping metal flood squeege blade 148 is operatively secured to front side edge portion of the support member 140, while a downwardly and rearwardly sloping rubber printing squeege blade 150 is operatively secured to the rear side edge portion of the support member 140.

Figure 5:
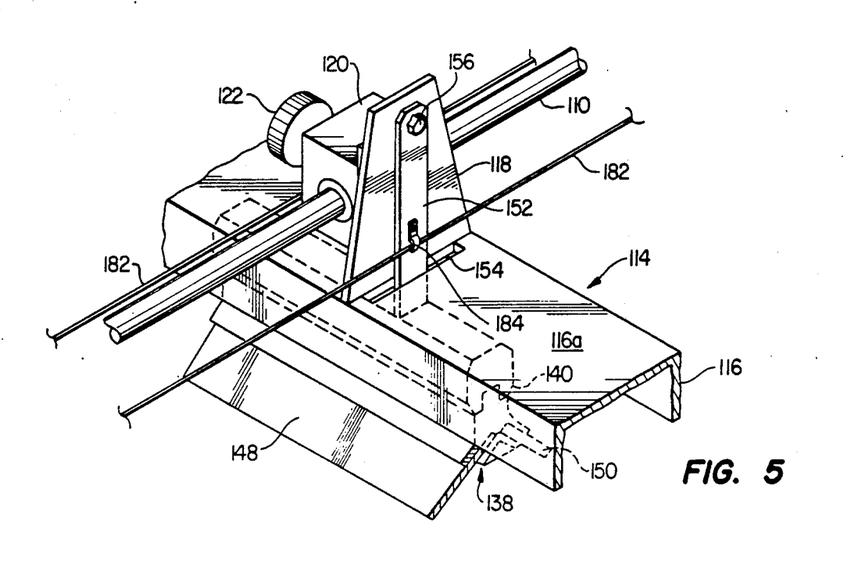
FIG. 5 is an enlarged scale fragmentary perspective view of a portion of the squeege assembly illustrating its pivotable and translatable connection to the printing arm support structure.

As illustrated in FIGS. 4 and 5, the squeege assembly 138 is pivotally mounted on the support member 116 by a pair of pivot arms 152. The arms 152 are anchored at their lower ends to the squeege support member 140, extend upwardly through slots 154 in the upper channel wall 116a, and are pivotally connected to the tabs 118 at pivot points 156 (FIG. 5).

It can be seen in FIG. 5 that a counterclockwise pivotal motion of the pivot arms 152 lowers the squeege element 148 relative to the support channel 116, while raising the squeege element 150 relative thereto. Conversely, a clockwise rotation of the pivot arms 152 lowers the squeege element 150 while raising the squeege element 148 relative to the support channel 116. As will be seen, this unique incorporation of the dual squeege assembly 138 into the squeege support structure 114 permits the squeege element 148 to be used in a flooding stroke as the squeege support structure 114 is moved rearwardly along the shafts 110 and 112, and permits the squeege element 150 to be used in a printing stroke as the structure 114 is moved forwardly along such shafts.

Figure 7:
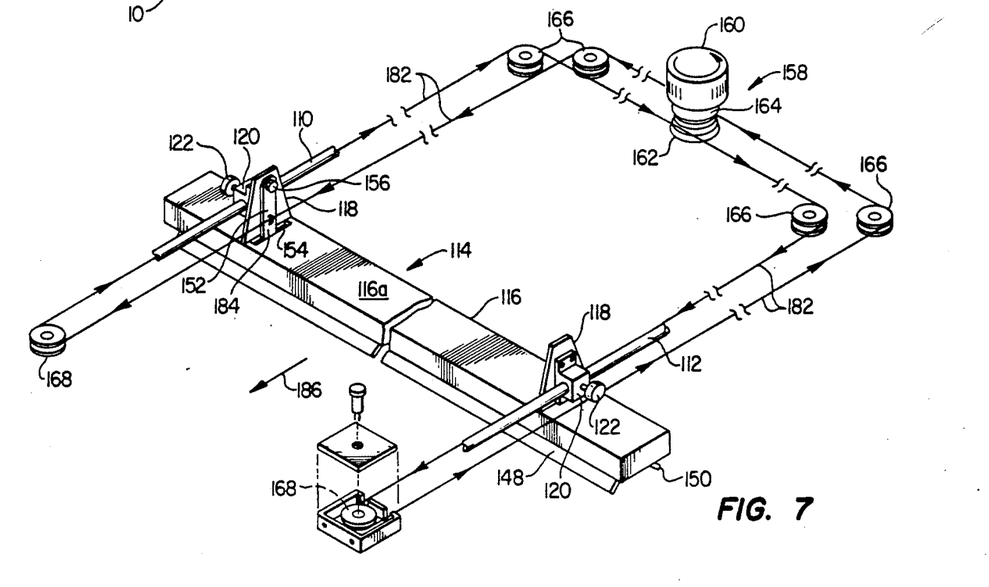
FIG. 7 is a schematic perspective view of a portion of the printing arm support structure illustrating the manner in which a cable system incorporated therein moves a pivotally mounted dual squeege assembly.

Such forward and rearward movement of the squeege support structure 114 along the shafts 110, 112 is effected by a motor-driven cable and pulley system 158 which is illustrated in FIGS. 4 and 7 and is carried by the printing arm structure for pivotal movement therewith. The system 158 includes a variable speed, reversible motor 160 carried by the rear side 98 of the arm assembly frame structure and operatively connected to a main drive pulley 162 by a downwardly extending drive shaft 164. System 158 is also provided with rear pairs of pulleys 166, positioned adjacent the rear ends of shafts 110 and 112, and front pulleys 168 positioned adjacent the front ends of the shafts 110, 112. Each of the pulleys 166, 168 is disposed within a suitable protective housing 170 (only one of which is illustrated in FIG. 7).

A single drive cable 182 is wrapped around the pulleys 162, 166 and 168, in the manner indicated in FIGS. 4 and 7, with inner side portions of the cable being anchored to the squeege pivot arms 152 at points 184 (FIG. 7).

It can be seen in FIG. 7 that a counterclockwise rotation of the main drive pulley 162 causes a forward translation of the squeege support structure 114 along the shafts 110 and 112 as indicated by the solid arrow 186, and movement of the cable relative to the various pulleys in the directions indicated on the cable itself. Movement of the cable in this manner simultaneously pivots the squeege carrier member 140 in a clockwise direction (as viewed in FIG. 5) to lower the rear squeege element 150. Conversely, clockwise rotation of the main drive pulley 162 as viewed in FIG. 7 rearwardly translates the squeege support structure 114, while reversing the cable movement directions, to thereby pivot the squeege carrier member 140 in a counterclockwise direction as viewed in FIG. 5 to lower the front squeege element 148 while the squeege carrier member 140 is being moved in a rearward direction.

Appropriate tightening of the screws 122 provides a sufficient translational resistance force on the squeege support structure 114 to assure that the squeege carrier member 140 remains in a fully pivoted position during translation of the structure 114.

Figures 8, 9, 10:
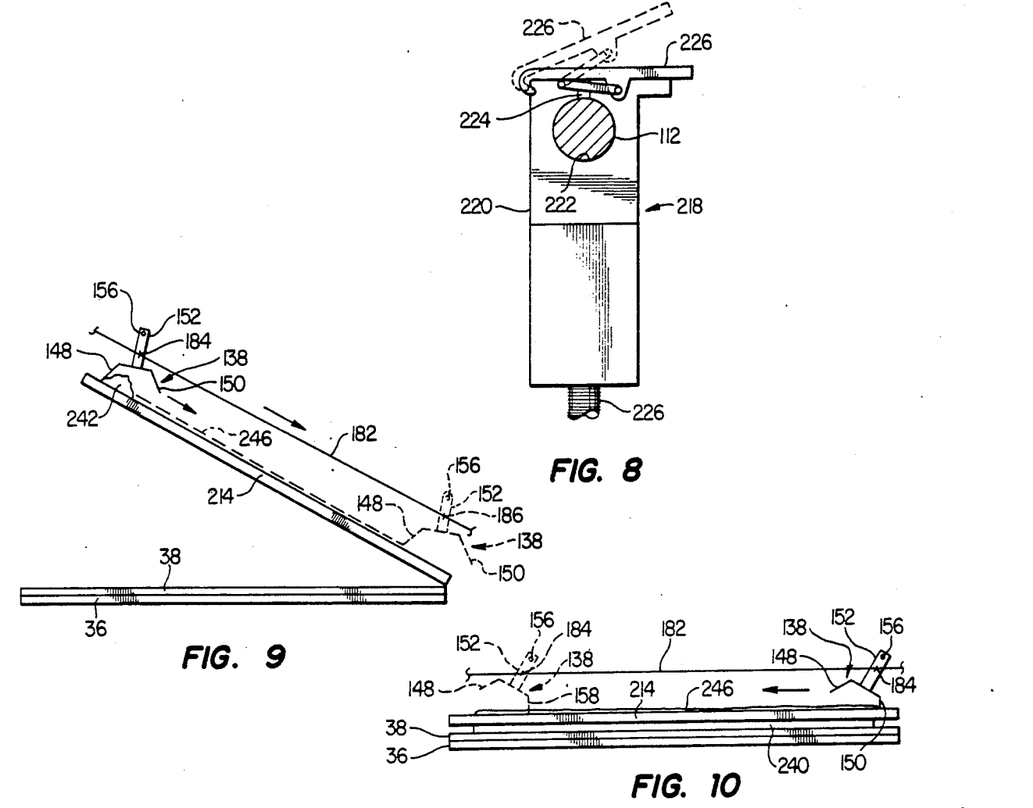
FIG. 8 is an enlarged scale partial cross-sectional view through the printing arm support structure, taken along line 8—8 of FIG. 4, illustrating the adjustable connection thereto of a representative screen holding structure.
FIG. 9 is a schematic side elevational view of an upper portion of the table, with various components removed therefrom for illustrative purposes, illustrating the flood stroke of the squeege assembly.
FIG. 10 is a view similar to that in FIG. 9 but illustrating the printing stroke of the squeege assembly.

Turning now to FIGS. 1, 2 and 8, the printing arm assembly 42 is pivotally connected, along its rear side portion 98, to the top ends of a pair of vertical support members 190 supported on the opposite rear corners of the table and projecting upwardly beyond the base frame structure 12. The arm assembly 42 may be selectively pivoted upwardly and downwardly relative to the base frame structure 12 by means of a pair of gear motors 192 (see also FIG. 4) which are electrically operated.

As best illustrated in FIG. 2, the lower ends of the vertical support members 190 extend downwardly into vertical housings 194 secured to the rear table support legs 14 and 16. The front sides of the lower end portions of the vertical support members 190 disposed within the housings 194 have rack gear teeth 196 formed thereon. The rack gear teeth 196 mesh with pinion gears 198 rotatably carried by the housings 194 and provided with hand operable knobs 200 (not illustrated in FIG. 1) which project outwardly of the housings 194. By suitably rotating these knobs 200, the vertical support members 190, and thus the printing arm structure 42, may be selectively raised or lowered relative to the balance of the table 10. Suitable tightening members 202 extend inwardly through vertical slots 204 formed through the housings 194, and are threaded into the lower ends of the vertical support members 190. By tightening the members 202 against the housings 194, the vertical support members 190 may be frictionally and releasably locked in selectively adjustable positions to releasably hold the printing arm assembly 42 at a predetermined height relative to the base frame structure 12.

Referring now to FIGS. 1-3 and 8, the front and rear side edges of a printing screen 214 may be releasably secured to the underside of the printing arm assembly 42 by means of front and rear screen clamping structures 216 and 218. Each of the clamping structures 216, 218 includes a vertically elongated metal block member 220 (see FIGS. 3 and 8) having a circular opening 222 formed through its upper end and slidably receiving one of the shafts 110, 112. The upper end of the opening 222 is slotted, as at 224, and the upper end of each block 220 is provided with an over-center latch mechanism 226 which may be selectively pivoted, as illustrated in FIG. 8, to releasably clamp the block 220 to its associated shaft 110 or 112. Accordingly, each of the blocks 220 may be adjusted lengthwise along its associated shaft 110 or 112 and then firmly anchored thereto using the latch mechanism.

Threaded into the bottom of each of the blocks 220 is a threaded rod 226 with upper and lower clamping jaw elements 228, 230 secured to its lower end. The jaws 228, 230 may be releasably clamped to the periphery of the printing screen 214 by means of an annular tightening member 232 threaded onto the rod 226 between the block 220 and the upper clamping jaw 228. It can be seen that the connection of the screen 214 to the printing arm assembly 42 in this matter permits the printing frame assembly and the screen to be pivoted together between raised and lowered positions.

In a manner subsequently described, the operation, control and sequencing of the back lights 46, the exposure lights 48, the vacuum pump 52, the exhaust fan 54, and other control elements of the table 10 are effected by a small control panel 234 (FIG. 1) mounted on a right front corner portion of the table 10 and appropriately interconnected with these various mechanisms.

Before describing in detail the various screen printing steps which the compact table structure 10 is uniquely adapted to perform, a summary of such steps will now be given with reference to FIGS. 11-15 in which such steps are depicted in highly schematic form. The first step (FIG. 11) in the overall screen printing process is to raise both the cover plate 38 and the printing arm assembly 42 and position an emulsion film sheet 236 and a film positive sheet 238 in a stacked position on the upper surface of the clear glass base plate 36 with the emulsion film sheet positioned atop the film positive sheet. The cover plate 38 (FIG. 12) and its underlying translucent foam sheet are then lowered onto the stacked sheets 236 and 238, the vacuum pump 52 is energized, and the exposure lights 48 are energized to expose the emulsion sheet 236. After the sheet 236 is suitably exposed, the vacuum pump and exposure lights are deactivated, the cover plate 38 is raised, and the exposed sheet 236 is removed and rinsed in the usual manner. The cover plate 38 is then lowered again to form a convenient work surface upon which the printing screen 214 is assembled using the exposed and rinsed emulsion sheet 236.

Figures 11, 12, 13, 14, 15:
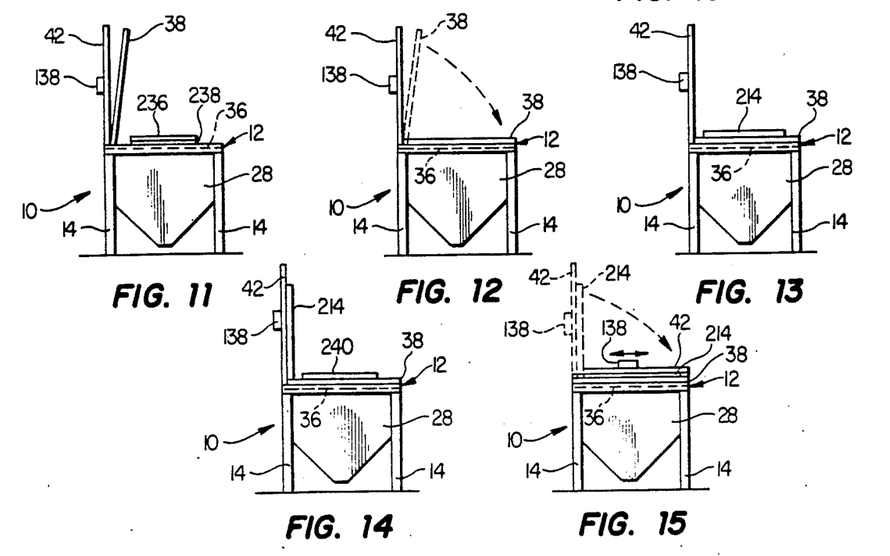
FIGS. 11-15 are highly schematic side elevational views of the table sequentially illustrating its overall operation from exposing an emulsion film sheet to using a finished screen to carry out the actual screen printing process.

Next, as illustrated in FIG. 13, with the cover plate 38 still lowered, the assembled printing screen 214 is positioned on the upper surface of the cover plate. The back lighting elements within the housing 28 are then energized to reveal imperfections in the emulsion sheet portion of the screen 214 so that appropriate blocking material can be used to correct these defects.

The screen is then removed and an imprintable item or substrate 240 (FIG. 14) is secured to the upper surface of the cover plate 38. The screen is then placed over the secured substrate in general operative alignment therewith and pivotally secured to the printing arm 42 as previously described. Next, the printing arm assembly 42 is lowered and secured to the screen as previously described, and the substrate is precisely aligned with the screen using the frame adjustment screws 93 (FIG. 1) to appropriately shift the cover plate 38 relative to the restrained screen. The screen is then "flooded" with a suitable printing ink, and the printing arm assembly 42 and the attached screen 214 are pivoted upwardly to their raised positions schematically depicted in FIG. 14.

Finally, the printing arm assembly 42 is lowered, as indicated in FIG. 15, to operatively position the screen 214 over the substrate, and the squeege assembly 138 is moved across the screen to force printing ink therethrough to carry out the actual substrate imprintation process.

As schematically illustrated in FIGS. 11-15, it can be seen that the table 10 provides a very compact structure which, with the exception of the emulsion rinsing process, performs all of the steps to carry out the screen printing process. Various of the table's components perform dual functions which advantageously eliminates the previous necessity of providing additional separate equipment which increases the required floor space and expense of such process. For example, the cover plate 38 not only cooperates with the base plate 36 to perform the initial exposure process, but also functions as a screen checking and backlighting surface to permit correction of the assembled screen. Additionally, the cover plate 38 not only cooperates with the base plate 36 to form an exposure and vacuum chamber, but also provides a convenient work surface for use in the screen assembly process and further defines a printing support surface to carry out the actual substrate imprintment step. As will be seen, the printing arm assembly 42, due to the incorporation therein of the pivotable dual squeege assembly 138, also provides substantial improvements in this final imprintation step.

For purposes of illustrative clarity, both the cover plate 38 and the printing arm assembly 42 in FIGS. 11-15 have been illustrated as being generally vertically oriented in their raised positions. However, these elements in their actual raised positions are tilted only at approximately 30° relative to the upper table surface.

Referring initially to FIG. 3, the various screen printing steps summarily described with reference to FIGS. 11-15 will now be described in greater detail. During the initial exposure process, the emulsion and film positive sheets 236, 238 are held in firm contact with one another by the open cell foam rubber sheet 94 secured to the undersurface of the cover plate 38. This firm contact between the sheets 236, 238 is greatly augmented by the operation of the vacuum pump 52 which functions to create a vacuum within the chamber 91 between the base and cover plates 36 and 38. Operation of the vacuum pump draws air from within the chamber 91 (sealed around its periphery by the gasket and seal structure 92) into the vacuum plenum 66 via the inlet openings 70 spaced along the hollow metal frame channel member 64. Air drawn into the vacuum plenum 66 is transferred into the rear table support leg 14 to which the vacuum hose 72 is connected and is drawn into the vacuum pump via the inlet hose 72. The vacuum created in this manner in the chamber 91 operates to significantly increase the contact force between the emulsion and film positive sheets 236, 238 so that extremely high quality "fine line" reproduction capabilities are achieved in the final imprintation process. The use of one of the table legs 14 as a vacuum transfer passage provides the previously described vacuum system with a high degree of compactness and efficiency.

After the exposed emulsion sheet is removed, it is suitably rinsed and incorporated in the printing screen 214 which is then checked and corrected as previously described. With the cover plate 38 in its lowered position, and the printing arm assembly 42 in its raised position, the assembled and corrected screen 214 is then secured to the printing arm assembly 42 using the previously described front and rear screen clamping structures 216, 218.

Referring now to FIGS. 9 and 10, the printing arm assembly 42 is then pivoted to its raised position, thereby pivoting the screen 214 upwardly as indicated. With the printing arm assembly 42 in its raised position, the dual squeege assembly 138 is in its rearwardly retracted dotted line position depicted in FIG. 9 in which the flood squeege blade 148 is pivoted downwardly into engagement with the upper surface of the screen 214. A quantity of printing ink 242 is then deposited on the screen 214 adjacent its forward side edge as indicated in FIG. 9.

A suitable "print" button on the control panel is then pushed to electrically cause the gear motors 192 to pivot the printing arm assembly 42 downwardly to its lowered position. Lowering of the printing frame assembly energizes the motor 160 (via appropriate control wiring not illustrated herein) to pivot the dual squeege assembly 138 in a clockwise direction to bring the printing squeege blade 150 into engagement with the upper surface of the frame 214 and move the squeege assembly 138 forwardly along the screen toward the dotted line position of the squeege assembly 138 indicated in FIG. 10. As the squeege assembly approaches the front side edge of the screen 214, it contacts a microswitch 244 (FIG. 4) carried by the shaft 110. The contacted microswitch, via appropriate control wiring in the control panel 234, causes the gear motors 192 to pivot the printing arm assembly 42 (and thus the printing screen 214) to its raised position.

The raising of the printing frame assembly 42 energizes and reverses the motor 160 to pivot the squeege assembly 138 in a counterclockwise direction to thereby lower the flood squeege blade 148 into engagement with the upper surface of the screen 214 and move the squeege assembly rearwardly along the screen 214 as depicted in FIG. 9. Rearward movement of the lowered squeege blade 148 draws the initially deposited printing medium 242 rearwardly along the screen, in a "flood" stroke of the squeege assembly, to deposit thereon an evenly distributed layer 246 of printing ink. As the squeege assembly 138 reaches its rearward-most dotted line position depicted in FIG. 9, it contacts a rear microswitch 248 (FIG. 4) carried by the shaft 110. Contacting of the microswitch 248 in this manner deactivates the drive motor 160.

After this initial "print" cycle has been completed to evenly deposit the ink layer 246 on the outer surface of the screen 214, the imprintable item or substrate 240 is suitably secured to the upper surface of the cover plate 238 in appropriate alignment with the screen 214. The "print" button on the control panel is then pushed again to cause the automatic lowering of the printing arm assembly 42 and the inked screen 214. The lowering of these elements causes the squeege assembly 138 to be moved forwardly through its printing stroke as depicted in FIG. 10 to force ink 246 downwardly through the screen 214 onto the imprintable item 240. When the squeege assembly reaches its forward most limit position, it again contacts the forward microswitch 244 which raises the printing arm assembly 42 and the screen 214 and moves the squeege assembly 138 through its "flood" stroke as depicted in FIG. 9. When the squeege assembly 138 again reaches its dotted line rear limit position depicted in FIG. 9, the motor 160 is de-energized. The printed substrate is then removed, a new substrate is positioned on the cover plate, and the "print" button is depressed again to repeat the previously described print and flood strokes of the squeege assembly 138 as the printing arm assembly 42 is automatically lowered and then raised.

During this imprintation portion of the screen printing process the exhaust fan 54 (FIG. 2) is energized to draw heavier-than-air ink fumes 250 (FIG. 3) from across the top of the table downwardly into the interior of frame section 58 through the channel member openings 76. The fumes 250 entering the interior of frame section 58 are drawn outwardly therefrom, via the opening 86, into the exhaust hose 88 (FIG. 1) and then into the inlet of the exhaust fan 54. The fume-laden exhaust air 250 is then passed through a replaceable charcoal filter 54a (FIG. 2) at the fan outlet to remove the ink fumes and discharge filtered air (via, for example, a suitable discharge hose 54b) back into the work area.

While the automated printing arm assembly 42, in conjunction with the unique pivotally mounted dual squeege assembly 138, provides a very rapid and efficient final imprintation process, it will be appreciated that, if desired, this printing arm and squeege structure could be replaced with a more conventional manual printing arm and squeege apparatus in which the printing frame raising and lowering, together with the forward and rear movement of a single squeege element, could be manually performed.

Schematically depicted in FIG. 16 is an alternate embodiment 10a of the screen printing table 10 in which components similar to those in table 10 have been given identical reference numerals, but with the subscripts "a", for comparative convenience. In the modified table 10a, the foam-backed cover plate 38a (which need not be translucent) is repositioned to the front of the dependent housing 28a whose sloping front side wall 30a is formed from a clear glass plate. The repositioned cover plate 38a is pivotally secured at its lower side edge 260 to the lower front side edge of the housing 28a to form with the glass housing wall 30a the vacuum exposure chamber 91a with which the relocated vacuum hose 72a is operatively communicated. The exposure lighting system 48a is relocated to the upper rear corner of housing 28a, and the backlighting elements 46a are positioned along the rear housing sidewall.

The base plate 36a (which is translucent) is mounted within the frame element 41a for movement by the adjustment screws 93a as previously described to define the registration and alignment means used to precisely align a substrate secured to the now movable plate 36a and a printing screen secured to the printing arm assembly 42a. It can be seen that in the modified printing table 10a schematically depicted in FIG. 16 the imprintation process, or a screen backlighting and checking process, may be carried out on the movable base plate 36a at the same time that an emulsion exposure process is being carried out in the relocated vacuum exposure chamber 91a.

In its preferred embodiments illustrated and described herein, the present invention provides a compact, multi-function screen printing apparatus which is of a relatively simple construction that provides very rapid and high quality commercial scale screen printing capabilities in a greatly reduced floor space area and at significantly reduced cost compared to conventional commercial screen printing apparatus.

The foregoing detailed description is to be clearly understood as being given by way of illustration and example only, the spirit and scope of the present invention being limited solely by the appended claims.

What is claimed is:
1. Compact, multi-function screen printing apparatus comprising:
   a first transparent plate member;
   support means for horizontally supporting said first plate member;
   a housing having an open upper end across which said first plate member extends;
   a second translucent plate member supported for movement between a first position permitting access to the upper side surface of said first plate member, and a second position in which said second plate member horizontally overlies said first first plate member in a spaced relationship therewith;
   holding means for holding an emulsion film sheet and a film positive sheet positioned in the space between said first plate member and said second plate member in its second position in firm contact with one another;
   exposure light means disposed within said housing and selectively operable to expose an emulsion sheet held between said first and second plate members and against a film positive sheet;
   backlighting means disposed within said housing and selectively operable to reveal imperfections in the exposed emulsion sheet when it is supported on the upper side surface of said second plate member in said second position thereof, to thereby facilitate correction of the exposed emulsion sheet;
   printing arm means carried by said support means for movement between a first position permitting access to the upper side surface of said second plate member in said second position thereof, and a second position in which said printing arm means overlie said second plate member in said second position thereof;
   positioning means for operatively positioning a printing screen, with the corrected emulsion sheet thereon, over an imprintable item positioned on the upper side surface of said second plate member in said second position; and
   squeege means, operatively supported by said printing arm means for movement relative thereto, for forcing a printing medium downwardly through the printing screen onto the imprintable item,
   whereby, with the exception of rinsing the exposed emulsion sheet, all of the steps necessary to carry out a screen printing process may be performed using said apparatus,
   said first plate member and said second plate member in said second position thereof defining therebetween an emulsion sheet exposure space operable in conjunction with said exposure light means,
   said second plate member in said second position thereof defining a work surface upon which a printing screen incorporating the exposed emulsion sheet may be fabricated,
   said second plate member defining a screen checking support surface upon which the fabricated printing screen may be positioned and, utilizing said backlighting means, checked for defects and corrected, and
   said second plate member in said second position thereof defining a printing support surface upon which an imprintable item may be positioned, held beneath the corrected printing screen, and imprinted utilizing said squeege means.

2. The screen printing apparatus of claim 1 wherein:
said holding means comprise a sheet of resilient material secured to the underside of said second plate member and adapted to engage and be compressed by the emulsion film and film positive sheets.

3. The screen printing apparatus of claim 2 wherein:
said sheet of resilient material is of a translucent foam rubber material.

4. The screen printing apparatus of claim 2 wherein:
said holding means further comprise vacuum forming means for selectively creating a vacuum in the space between said first plate member and said second plate member in said second position thereof, and seal means for creating a peripheral seal between said first plate member and said second plate member in said second position thereof.

5. The screen printing apparatus of claim 4 wherein:
said support means comprising a table structure having base frame means supported in a horizontal, elevated position by a plurality of support leg means, at least one of which is of a hollow construction, said base frame means defining an opening which receives said first plate member and extends across said open upper end of said housing, said base frame means further defining a vacuum plenum structure extending around an upper peripheral portion of said table structure, said vacuum plenum structure having a first opening therein which communicates with the space between said first plate member and said second plate member in said second position thereof, and a second opening communicating with the interior of said at least one of said plurality of support leg means, and said vacuum forming means include vacuum pump means having an inlet communicating with the interior of said at least one of said plurality of support leg means.

6. The screen printing apparatus of claim 1 further comprising exhaust means for exhausting printing medium fumes from said apparatus.

7. The screen printing apparatus of claim 6 wherein:
said support means comprise a table structure having base frame means supported in a horizontal, elevated position by a plurality of support leg means, said base frame means defining an opening which receives said first plate member and extends across said open upper end of said housing, said base frame means having a portion defining a channel area extending around its periphery and having a series of exhaust inlet openings formed in an upper surface portion thereof and communicating with its interior, and said exhaust means include said channel area, an exhaust conduit communicating with the interior of said channel area for receiving air from said channel area, and exhaust fan means having an inlet operatively connected to said exhaust conduit.

8. The screen printing apparatus of claim 1 wherein:
said support means comprise a table structure having base frame means supported in a horizontal, elevated position by a plurality of support leg means, said apparatus further comprises a support frame in which said second plate member is pivotally mounted for movement between said first and second positions thereof, said support frame being slidably carried by said base frame means for movement relative thereto, and said apparatus further comprises adjustment means for adjustably moving said support frame relative to said base frame means and holding said support frame in its adjusted position.

9. The screen printing apparatus of claim 8 wherein:
said positioning means include means for securing a rear side edge portion of a printing screen to a rear portion of said printing arm means, and means for securing a front side edge portion of the screen to a front portion of said printing arm means for movement therewith to position the printing frame over a substrate secured to the upper side surface of said second plate member in said second position thereof, and said adjustment means are operative to move said support frame to bring the substrate into precise alignment with the printing screen.

10. The screen printing apparatus of claim 9 further comprising:
means for selectively adjusting the height of said printing arm means relative to said base frame means, and means for horizontally leveling said printing arm means in said second position thereof.

11. The screen printing apparatus of claim 1 wherein:
said squeege means include a squeege support member having first and second squeege elements secured thereto, and wherein said apparatus further comprises:

mounting means for mounting said squeege means on said printing arm means for translational movement relative thereto in first and second directions, and pivotal motion relative thereto between a first position in which said first squeege element is lowered into an operative position, and a second position in which said second squeege element is lowered into an operative position, and drive means for driving said squeege support member in a selected one of said first and second directions relative to said printing arm means, for pivoting said squeege support member to said first position thereof in response to driven movement of said squeege support member in said first direction, and for pivoting said squeege support member to said second position thereof in response to driven movement of said squeege support member in said second direction.

12. The screen printing apparatus of claim 11 wherein:
said mounting means include a support element, securing means for securing said support element to said printing arm means for movement relative thereto in said first and second directions, and pivot means for connecting said squeege support member to said support element for pivotal movement relative thereto between said first and second positions of said squeege support member, and said drive means include pulley means carried by said printing arm means, cable means operatively connected to said pulley means, reversible drive means operatively connected to said pulley means for selectively driving said cable means in opposite directions, and anchor means for anchoring said cable means to said pivot means.

13. The screen printing apparatus of claim 12 wherein:
said securing means include a plurality of bearing shafts carried by said printing means, a plurality of attachment plates secured to said support element, and a plurality of slide bearing elements secured to said attachment plates and slidably receiving said bearing shafts, said support element has a plurality of slots formed therethrough, said pivot means include a plurality of pivot members each pivoted at one end to one of said attachment plates, extending through one of said slots, and being secured at an opposite end to said squeege support member, and said cable means are anchored to said pivot members.

14. The screen printing apparatus of claim 13 further comprising:
adjustable means for frictionally retarding movement of said support element relative to said printing arm means.

15. The screen printing apparatus of claim 14 wherein:
said adjustable means comprise tensioning members secured to said support element and having openings through which said shafts extend, and means within said opening for frictionally engaging said shafts.

16. The screen printing apparatus of claim 11 further comprising control means for:

moving said printing arm means from said first position thereof to said second position thereof and energizing said drive means to drive said squeege support member in said first direction from a first limit position to a second limit position, sensing the movement of said squeege support member to said second limit position and responsively moving said printing arm means to said first position and reversing said drive means to drive said squeege member in said second direction from said second limit position to said first limit position, and sensing the movement of said squeege support member to said first limit position and responsively de-energizing said drive means.

17. Screen printing table apparatus comprising:
a base frame having an opening extending vertically therethrough;
support leg means for holding said base frame in an elevated position;
a housing positioned below said base frame and having an open upper end across which said frame opening extends;
a transparent base plate member horizontally supported by said base frame and extending across said opening therein;
a translucent cover plate member supported on said base frame for pivotal motion between a raised position permitting access to the upper side surface of said base plate member, and a lowered position in which said cover plate member extends horizontally across said base plate member,
the facing upper and lower side surfaces of the base plate member and the lowered cover plate member, respectively, defining a space therebetween in which a film positive sheet and an emulsion sheet positioned there against may be positioned during exposure of the emulsion sheet,
the upper side surface of said cover plate member in its lowered position forming a work surface upon which an imprintable item may be secured and imprinted using a printing screen positioned over the item, and a checking surface upon which an exposed emulsion sheet may be supported to check for imperfections therein;
holding means for selectively creating a vacuum in said space between said base and cover plate members, and for holding an emulsion sheet and a film positive sheet, positioned between said base and cover plate members, in firm contact with one another during exposure of the emulsion sheet;
exposure light means disposed within said housing and selectively operable to expose the emulsion sheet held between the base and cover plate members and against the film positive sheet;
backlighting means disposed within said housing and selectively operable to reveal imperfections in the exposed emulsion sheet when it is supported on the upper side surface of said cover plate member in its lowered position, to thereby facilitate correction of the exposed emulsion sheet;
printing arm means for movably supporting a squeege structure adapted to be moved along said printing arm means to force a printing medium through a printing screen and onto the imprintable item, said printing arm means being secured to said portion of said base frame for pivotal motion between a raised position permitting access to the upper side surface of said cover plate member in its lowered position, and a lowered position in which said printing arm means overlie said cover plate member in its lowered position;
connection means for releasably connecting a printing screen to said printing arm means in a manner such that the printing screen operatively overlies an imprintable item positioned on the upper side surface of said cover plate member in its lowered position; and
a squeege structure operatively supported by said printing arm means for movement relative thereto.

18. The screen printing table apparatus of claim 17 wherein:
said base frame has a peripheral vacuum plenum formed therein which communicates with said space between said base plate member and said cover plate member in said lowered position thereof, and
said holding means include seal means for creating a peripheral seal between said base plate member and said cover plate member in said lowered position thereof, a vacuum pump having an inlet communicating with the interior of said vacuum plenum, and a sheet of resilient material secured to the lower side surface of said cover plate member and adapted to engage the emulsion sheet.

19. The screen printing table apparatus of claim 18 wherein:
one of said support leg means has a hollow interior communicating with the interior of said vacuum plenum, and
said vacuum pump inlet communicates with the interior of said one of said support leg means.

20. The screen printing table apparatus of claim 17 further comprising:
exhaust means for exhausting printing fume-laden air from adjacent the upper surface of said cover plate member in said lowered position thereof.

21. The screen printing table apparatus of claim 20 wherein:
said exhaust means include means for defining an exhaust channel area extending around the periphery of said base frame and having a series of inlet openings formed through an upper surface portion thereof, an exhaust conduit communicating with the interior of said channel area, an exhaust fan having an inlet operatively connected to said exhaust conduit, and filter means associated with said exhaust fan for filtering the fume-laden air traversing said exhaust fan.

22. The screen printing table apparatus of claim 17 wherein:
said squeege structure includes a squeege support member having first and second squeege elements secured thereto, said squeege support member being mounted on said printing arm means for translational movement relative thereto in first and second directions, and pivotal movement relative thereto between a first position in which said first squeege element is lowered into an operative position and a second position in which said second squeege element is lowered into an operative position, and
said apparatus further comprises drive means for selectively driving said squeege support member in said first and second directions, means for pivoting said squeege support member to its first position in response to movement thereof in said first direction, and means for pivoting said squeege support member to its second position in response to movement thereof in said second direction.

23. The screen printing table apparatus of claim 22 wherein:
said drive means include cable and pulley means carried by said printing arm means and drivable in opposite directions to selectively move said squeege support member in said first and second directions thereof, and reversible motor means drivingly connected to said cable and pulley means.

24. The screen printing table apparatus of claim 22 further comprising control means for:
pivoting said printing arm means from said raised position thereof to said lowered position thereof and energizing said drive means to drive said squeege support member in said first direction from a first limit position to a second limit position,
sensing the movement of said squeege support member to said second limit position and responsively pivoting said printing arm means to said raised position thereof and reversing said drive means to drive said squeege support member in said second direction from said second limit position to said first limit position, and
sensing the movement of said squeege support member to said first limit position and responsively de-energizing said drive means.

25. The screen printing table apparatus of claim 17 wherein:
said cover plate member is pivotally carried within a support frame slidably supported on said base frame for movement relative thereto, and
said apparatus further comprises adjustment means for selectively adjusting the position of said support frame relative to said base frame and for holding said support frame in its adjusted position.

26. The screen printing table apparatus of claim 25 wherein:
said adjustment means comprise a plurality of frame adjustment screw members extending inwardly through said base frame and bearing at their inner ends against a side edge portion of said support frame, said screw members being rotatable relative to said base frame to move said support frame relative thereto, and spring means for resiliently resisting said movement of said support frame relative to said base frame.

27. Screen printing apparatus comprising:
a table structure having a translucent top surface portion;
lighting means positioned beneath said top surface portion and selectively operable to pass light upwardly therethrough;
cover plate means, carried by said table structure for pivotal movement relative thereto, for selectively covering said top surface portion to form therewith an exposure chamber adapted to receive, in a stacked relationship, a film positive sheet and an emulsion film sheet;
vacuum forming means for selectively creating a vacuum in said exposure chamber;
a printing arm pivotally connected to said table structure and positioned above said top surface portion and said cover plate means; and
squeege means carried by said printing arm for movement relative thereto along a printing screen supported on said cover plate means to force a printing medium through the screen.

28. The screen printing apparatus of claim 27 wherein:
said squeege means include a squeege support member having a flood squeege element and a printing squeege element secured thereto, and
said screen printing apparatus further comprises reversible drive means for selectively driving said squeege support member in first and second directions relative to said printing arm, means for moving said printing squeege element into operative engagement with the screen during driven movement of said squeege support member in said first direction, and means for moving said flood squeege element into operative engagement with the screen during driven movement of said squeege support member in said second direction.

29. The screen printing apparatus of claim 28 wherein:
said means for moving said printing squeege element include means for pivoting said squeege support member in a first direction relative to said printing arm, and
said means for moving said flood squeege element include means for pivoting said squeege support member in a second direction relative to said printing arm.

30. A method of imprinting selected indicia on an item, comprising the steps of:
horizontally supporting a transparent base member;
supporting a cover member for pivotal movement between a lowered position in which said cover member overlies said base member, and a raised position;
supporting a printing arm for pivotal movement between a lowered position in which said printing arm overlies said cover member in its lowered position, and a raised position;
movably mounting a squeege structure on said printing arm;
positioning an exposure light source beneath said base member;
positioning a backlighting source beneath said base member;
exposing an emulsion sheet by positioning it between said base member and said cover member in its lowered position, and atop a film positive sheet, while operating said exposure light source and creating a vacuum between said base member and said cover member;
utilizing the exposed emulsion sheet to form a printing screen;
checking the exposed emulsion sheet for defects by positioning the printing screen on said cover member in its lowered position and operating said backlighting source; and
forming indicia on an imprintable item by lowering said cover member, positioning the item on the lowered cover member, positioning said printing screen over the item, applying a printing medium to said printing screen, lowering said printing arm, and moving said squeege structure along said printing screen to force said printing medium therethrough onto said imprintable item.

31. A method of imprinting selected indicia on an item, comprising the steps of:

providing a printing table having an elevated base frame with an opening extending vertically therethrough, a transparent base plate horizontally supported by said base frame and extending across said opening, a translucent cover plate carried by said base frame for pivotal movement between raised and lowered positions, and a printing arm pivotally secured to a side portion of said base frame for movement between raised and lowered positions and having a squeege structure movably carried thereby;

positioning a light housing beneath said base plate, said light housing having exposure lighting and backlighting means therein, and an open upper end across which said base plate extends, raising said cover plate;

placing a film positive sheet on said base plate;

placing an emulsion sheet on the film positive sheet;

lowering said cover plate;

holding the film positive and emulsion sheets in firm contact with one another by transferring a portion of the cover plate weight to the sheets and by creating a vacuum between the base and cover plates;

exposing the emulsion sheet by operating said exposure lighting means;

raising said cover plate;

removing the film positive sheet and the exposed emulsion sheet;

rinsing the removed emulsion sheet;

utilizing the rinsed emulsion sheet to form a printing screen;

lowering said cover plate;

positioning the printing screen on the lowered cover plate;

operating said backlighting means to reveal emulsion defects in said printing screen;

correcting said emulsion defects as necessary;

removing said printing screen;

securing an imprintable item to the upper side surface of the lowered cover plate;

operatively securing said printing screen to said printing arm;

applying a printing medium to said printing screen;

lowering said printing arm; and moving said squeege structure along said printing screen to force said printing medium therethrough and onto the imprintable item.

32. Screen printing apparatus comprising:

a table structure having an elevated base frame;

a housing depending from said base frame and having an open upper end generally bordered by said base frame, said housing having a transparent side wall extending downwardly from said base frame;

a support frame slidably supported on said base frame for horizontal movement relative thereto, said support frame having a translucent base plate supported therein, said base plate forming a work surface for assembling a printing screen thereon, a screen checking surface, and a printing surface upon which an imprintable substrate may be secured;

a printing arm pivotally connected to said base frame;

squeege means carried by said printing arm for movement relative thereto along a printing screen to force a printing medium through the screen onto a substrate secured to the upper side surface of the cover plate;

adjustment means for selectively adjusting the position of said support frame relative to said base frame to bring the substrate into precise alignment with the printing screen;

a cover plate pivotally secured over said transparent housing side wall to form therewith an exposure chamber for receiving a screen emulsion sheet to be exposed;

means for forming a vacuum within said exposure chamber;

first lighting means disposed within said housing for directing exposure light outwardly through said transparent housing sidewall into said exposure chamber; and second lighting means disposed within said housing for directing backlighting upwardly through said translucent base plate to reveal imperfections in an exposed emulsion sheet positioned thereon.

* * * * *

UNITED STATES PATENT AND TRADEMARK OFFICE
CERTIFICATE OF CORRECTION

PATENT NO. : 5,048,417

DATED : September 17, 1991

INVENTOR(S) : Michael A. Everroad

It is certified that error appears in the above-identified patent and that said Letters Patent is hereby corrected as shown below:

ON THE TITLE PAGE:
Under References Cited, change the following:
3,788,215, delete "11/1974" date and add --1/1974--.
Delete "4,569,832" and add --4,569,283--.
Delete "4,606,688" and add --4,606,268--.

On the third line from the end of the Abstract, delete "slopping" and add --sloping--.

Column 16, line 58, delete "comprising" and add --comprise--.

Signed and Sealed this

Twelfth Day of January, 1993

Attest:

DOUGLAS B. COMER

*Attesting Officer*  *Acting Commissioner of Patents and Trademarks*